United States Patent [19]
Hashimoto

[11] Patent Number: 5,438,014
[45] Date of Patent: Aug. 1, 1995

[54] METHOD OF MANUFACTURING SEMICONDUCTOR DEVICE

[75] Inventor: Takasuke Hashimoto, Tokyo, Japan

[73] Assignee: NEC Corporation, Tokyo, Japan

[21] Appl. No.: 355,906

[22] Filed: Dec. 14, 1994

[30] Foreign Application Priority Data

Dec. 17, 1993 [JP] Japan ................. 5-0318691

[51] Int. Cl.$^6$ .............. H01L 21/329; H01L 21/225
[52] U.S. Cl. .................... 437/60; 437/164; 437/918; 148/DIG. 150
[58] Field of Search ............ 437/60, 918, 47, 164, 437/163; 148/DIG. 136, DIG. 150

[56] References Cited

U.S. PATENT DOCUMENTS

| | | | |
|---|---|---|---|
| 4,489,104 | 12/1984 | Lee | 437/173 |
| 4,502,894 | 3/1985 | Seto et al. | 437/918 |
| 4,954,454 | 9/1990 | Kobushi et al. | 437/21 |
| 5,028,564 | 7/1991 | Chang et al. | 437/164 |
| 5,185,285 | 2/1993 | Hasaka | 437/47 |

FOREIGN PATENT DOCUMENTS

| | | | |
|---|---|---|---|
| 61-228661 | 10/1986 | Japan . | |
| 1262621 | 10/1989 | Japan | 437/164 |
| 0548008 | 2/1993 | Japan . | |

OTHER PUBLICATIONS

H 546; Schnable et al; U.S. Statutory Invention Registration; Nov. 1, 1988.

Primary Examiner—Brian E. Hearn
Assistant Examiner—Michael Trinh
Attorney, Agent, or Firm—Popham, Haik, Schnobrich & Kaufman, Ltd.

[57] ABSTRACT

A polycrystalline silicon film pattern 3 having a thickness of below 120 nm is formed on a silicon oxide film 2 provided on the principal surface of a silicon substrate 1. The polycrystalline silicon film pattern 3 is covered with a boron silicate glass film 4. By heat treatment, boron is diffused from the boron silicate glass film 4 to the polycrystalline silicon film pattern 3 to form a polycrystalline silicon resistance element 5 containing boron at a density of above $1 \times 10^{19}$ atoms/cm$^3$. As a result, the temperature coefficient of the resistance element 5 comprising the polycrystalline film can be reduced.

5 Claims, 4 Drawing Sheets

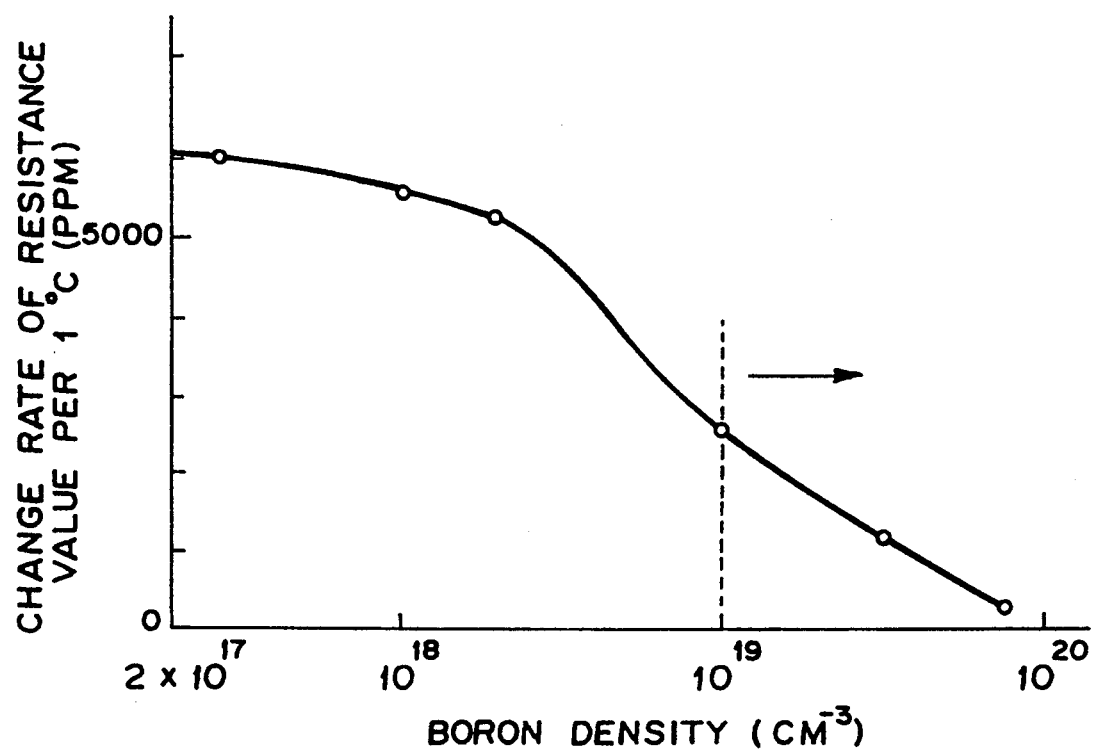

METHOD OF MANUFACTURING SEMICONDUCTOR DEVICE

FIELD OF THE INVENTION

The present invention relates to a method of manufacturing a semiconductor device and, in particular, to a method of forming a polycrystalline silicon film of the semiconductor device having a resistance element comprising a polycrystalline film.

BACKGROUND OF THE INVENTION

A prior art is hereinafter described with reference to FIGS. 1A through 1C.

First, a polycrystalline silicon film 13 is grown to a predetermined thickness on a silicon oxide film 2 formed on the principal surface of a silicon substrate 1, an impurity is introduced by ion implantation, and a heat treatment is effected for activation (FIG. 1A). Next, the polycrystalline silicon film 13 is patterned in the form of a resistance element 15 (FIG. 1B). After the resistance element 15 is covered with an interlayer insulating film 14, an electrode line 6 made of a metal such as Al or the like is connected to a contact portion of the resistance element 15 through a contact hole formed through the interlayer insulating film 14 (FIG. 1C).

In the resistance element using such a thin film polycrystalline silicon film, temperature dependence of the conductivity of the polycrystalline silicon is determined by the height of a potential barrier beyond which the carrier goes at a grain boundary. If the impurity density within the grain is lowered, then the potential barrier becomes high and, if the temperature is elevated, then the conductivity becomes large. That is, the smaller the polycrystalline silicon is in the impurity density, the greater negative temperature coefficient (the higher the temperature is, the lower the resistance value becomes) it acquires.

If such a polycrystalline silicon resistance element having a greater negative temperature coefficient is used, for example, within a bipolar memory of a great power consumption, it does not only pose a constraint on the design of operating point, but also causes thermal run-away. Therefore, it is important to reduce the temperature coefficient of the resistance element.

As one of the measures for reducing the temperature coefficient of the resistance value, there is one in which when the resistance element is formed in the predetermined planar form, the thickness of the polycrystalline silicon film is thinned to increase the impurity density.

In FIGS. 1A through 1C, in order to thin the film thickness, it is necessary to lower an accelerating voltage of the ion implantation while increasing the amount of dosed ion. That is, it is necessary to lower the accelerating voltage so that even if the film thickness is thinned the ion may not penetrate the polycrystalline silicon film. However, if the accelerating voltage is lowered, then it becomes difficult to focus the beam, and the dispersion of energy becomes great. In the state-of-the-art equipment, 10 keV poses a lower minimum limit to the accelerating voltage, which cannot be sufficiently lowered.

Further, if the amount of dosed ion is increased, then a period of time during which the ion is implanted becomes long.

If, in order to reduce the dispersion of energy with the amount of dosed ion kept constant, only the accelerating voltage is increased, then the peak of the impurity density will come outside of the polycrystalline silicon film, and the impurity density within the polycrystalline silicon film will be lowered. Therefore, in order to increase the accelerating voltage to obtain the same impurity density within the polycrystalline silicon film, it is necessary to further increase the amount of dosed ion, which further increases the period of time during which the ion is implanted.

On the other hand, when the insulating film is formed on the polycrystalline silicon film and thereafter the ion is implanted, since the accelerating voltage is increased, the energy dispersion becomes small. However, in this case, since the impurity is also implanted into the insulating film, a large amount of dosed ion also becomes necessary until the impurity is added by an amount needed for the polycrystalline silicon film, and it takes a long time to implant the ion.

As shown in FIG. 2, when the density of the impurity (boron) within the polycrystalline silicon film is $1 \times 10^{19}$ atoms/cm$^3$, since the temperature coefficient (change rate of the resistance value per 1 degree Centigrade) becomes below 3000 ppm, which corresponds to about a half of the temperature coefficient for the case in which it is $1 \times 10^{18}$ atoms/cm$^3$, it is free in practice of any problem. Therefore, it is preferable to set the impurity density of the polycrystalline silicon forming the resistance element to above $1 \times 10^{19}$ atoms/cm$^3$.

In order to obtain the impurity density of $1 \times 10^{19}$ atoms/cm$^3$ for the polycrystalline silicon film according to the ion implantation process, it is necessary to lower the accelerating voltage, but as described above, according to the state-of-the-art equipment, 10 keV is the lower minimum limit and yet, with this 10 keV, the dispersion or variation of the impurity density becomes $\pm 60\%$, and no practical resistance element can be obtained. The lower limit of the variation of the impurity density, from the practical point of view, is $\pm 30\%$, but to this end, it is necessary to set the accelerating voltage to 15 keV. However, in order to set the impurity density of the polycrystalline silicon film to $1 \times 10^{19}$ atoms/cm$^3$ or above under this condition, it is necessary to set the peak impurity density within the polycrystalline silicon film to $1 \times 10^{20}$ atoms/cm$^3$ or above and to make this peak impurity density lie within the polycrystalline silicon film. In order to satisfy these conditions, the thickness of the polycrystalline silicon film need to be greater than 100 nm (preferably greater than 120 nm), and the thickness of below 100 nm cannot meet the foregoing conditions.

As described above, in order to reduce the temperature coefficient of the resistance element, it is necessary to set the impurity density to above $1 \times 10^{19}$ atoms/cm$^3$, and if the thickness of the polycrystalline silicon film is correspondingly set to below 100 nm in order to obtain the same sheet resistance as when the low impurity density is used, then the ion implantation technique cannot be used.

Further, when a thin polycrystalline silicon film is used, if in order to reduce the variation of the impurity density the accelerating voltage is increased, then the ion penetrates not only the polycrystalline silicon film, but also the insulating film therebelow, forming an undesired impurity area at the silicon substrate therebelow. Therefore, it becomes practically impossible to set the thickness of the insulating film which lies below the polycrystalline silicon film to below 300 nm, which poses a constraint on thinning the insulating film in order to improve the diffusion of the heat which is generated at the resistance element.

SUMMARY OF THE INVENTION

An object of the present invention is to provide a semiconductor device having a resistance element comprising a polycrystalline film, the resistance element having a reduced temperature coefficient.

A feature of the present invention lies in a method of manufacturing a semiconductor device comprising steps of:

- patterning a polycrystalline silicon film formed on an insulating film provided on the principal surface of a semiconductor substrate to form a polycrystalline silicon film pattern having a thickness of below 120 nm on the insulating film;
- covering the polycrystalline silicon film pattern with a silicate glass film containing a p-type or n-type impurity;
- diffusing the impurity from the silicate glass film to the polycrystalline silicon film pattern by heat treatment to make the polycrystalline silicon film pattern contain the impurity to a density of above $1 \times 10^{19}$ atoms/cm$^3$ to form a resistance element made of a polycrystalline silicon.

Here, the foregoing impurity may be boron, and the foregoing silicate glass film may be born silicate glass film. Otherwise, the former may be phosphor, and the latter may be phosphor silicate glass film. Further, the polycrystalline silicon film pattern may comprise a resistance body portion which determines the resistance value and contact portions each lying at the both sides of the resistance body portion. After the diffusion by the foregoing heat treatment, a contact hole reaching the contact portion is formed through the silicate glass film, and a metallic electrode line connected to the contact portion through the contact hole is formed. Further, the insulating film may have a thickness of below 300 nm.

According to the present invention, since the resistance element can be formed by a polycrystalline silicon film having a thickness of below 120 nm (preferably below 100 nm) and an impurity density of $1 \times 10^{19}$ atoms/cm$^3$, the temperature coefficient thereof can be reduced unquestionably in practice and a highly reliable semiconductor device can be thereby obtained.

BRIEF DESCRIPTION OF THE DRAWINGS

FIG. 2 is a diagram illustrating a relationship between the boron density within the polycrystalline silicon film (resistance element) and the change rate of the resistance value per 1 degree Centigrade;

DESCRIPTION OF THE PREFERRED EMBODIMENTS

The present invention is described with reference to the accompanying drawings.

Figure 1A:
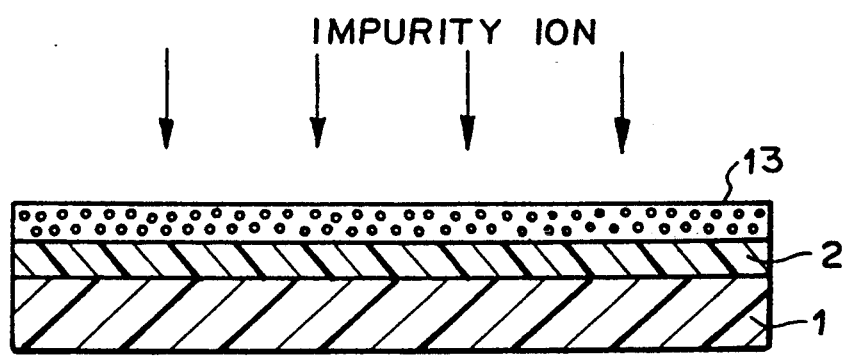
FIGS. 1A through 1C are respectively a cross-sectional view of a conventional method of manufacturing a semiconductor device as illustrated in the order of processes followed.
Figure 1B:
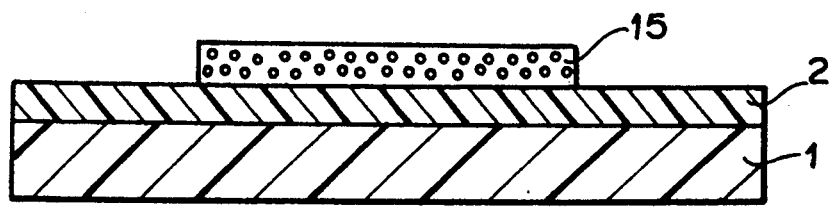
Figure 1C:
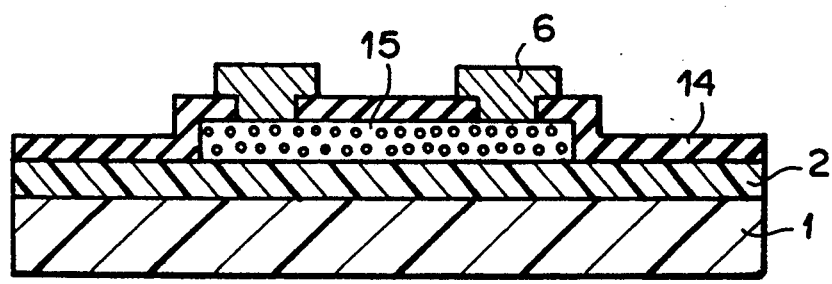
Figure 3A:
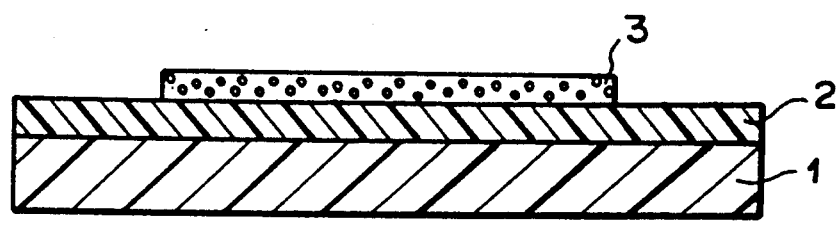
FIGS. 3A through 3C are respectively a cross-sectional view of a specific embodiment of the method of the present invention as illustrated in the order of processes followed.
Figure 3B:
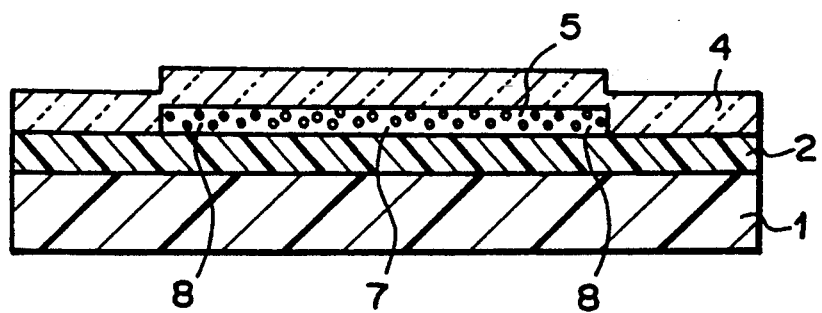
Figure 3C:
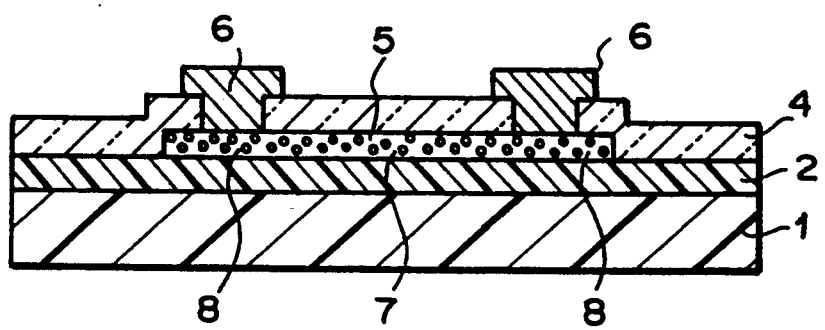
Figure 4:
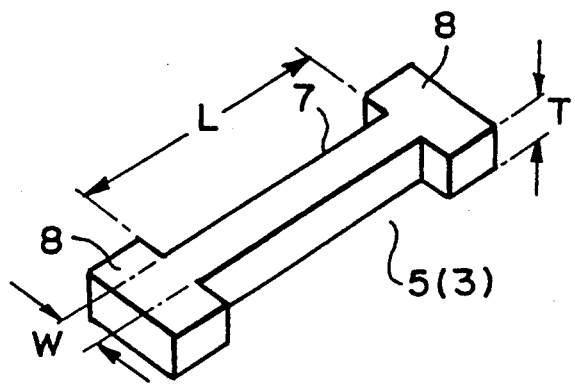
FIG. 4 is a perspective view illustrating a resistance element according to a specific embodiment of the present invention.

FIGS. 3A through 3C are respectively a cross-sectional view of a specific embodiment of the method of the present invention as illustrated in the order of processes followed. In order to improve the thermal diffusion from the resistance element, a thin silicon oxide film 2 having a thickness of below 300 nm and preferably above 50 nm, for example 100 nm, is formed on the principal surface of a silicon substrate 1 by thermal oxidation method or the like, on which a polycrystalline silicon film of below 120 nm and preferably above 10 nm, in film thickness is grown to remove the unnecessary portion of the polycrystalline silicon film by etching to form a polycrystalline silicon film pattern 3 of below 120 nm (preferably 100 nm or below) and preferably above 10 nm in film thickness, having a shape illustrated in the perspective view of FIG. 4 (FIG. 3A).

Next, a borosilicate glass (BSG) film 4 having a thickness of, for example, 300 nm is deposited on the polycrystalline silicon pattern 3. Heat treatment is applied thereto at the temperature of above 800 degrees Centigrade to diffuse boron from the boron silicate glass film 4 to the polycrystalline silicon film pattern 3 to make the polycrystalline silicon film pattern 3 contain the boron to the density of above $1 \times 10^{19}$ atoms/cm$^3$ and preferably below $1 \times 10^{20}$ atoms/cm$^3$ to form a resistance element 5. This resistance element, as illustrated in the perspective view of FIG. 4, has a resistance body portion 7, the resistance value of which is determined by the length L, width W, the film thickness T of below 120 nm and the boron density of above $1 \times 10^{19}$ atoms/cm$^3$, and wide contact portions 8 each formed continuously on the both ends of the body portion 7. Here, for example, L is 2 μm, W 0.6 μm, T 100 nm (FIG. 3B).

Next, by using the boron silicate glass film 4, which was used as a source for diffusing the boron, as the interlayer insulting film, a contact hole reaching the contact portion 8 is formed through the boron silicate glass film 4, and an aluminum electrode line 6 connected to the contact portion 8 is formed through the contact hole (FIG. 3C).

The sheet resistance of the resistance element can be controlled according to the boron density within the boron silicate glass film.

Figure 5:
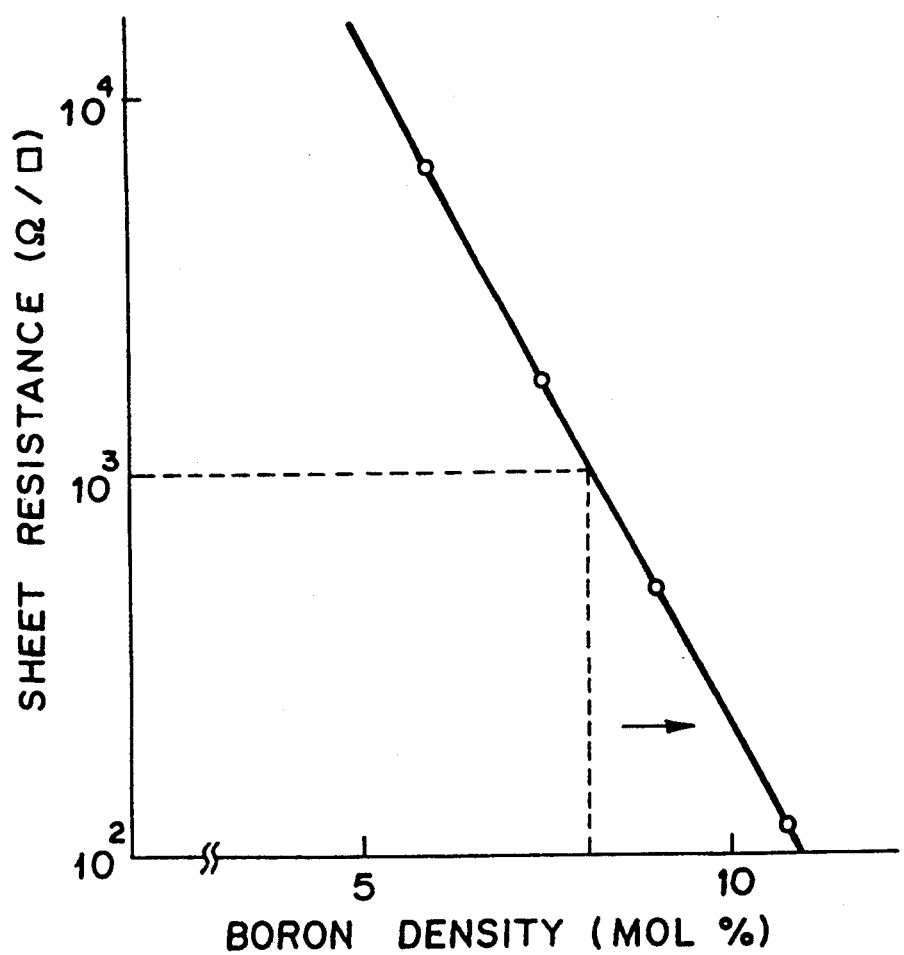
FIG. 5 is a diagram illustrating a relationship between the boron density within the boron silicate glass film and the sheet resistance of the polycrystalline silicon film.

FIG. 5 illustrates a relationship between the sheet resistance and the boron density within the boron silicate glass film when the polycrystalline silicon film having a thickness of 100 nm is used and the heat treatment was conducted at the temperature of 900 degrees Centigrade for 20 min. Since the boron density of above $1 \times 10^{19}$ atoms/cm$^3$ is required, in order to set the sheet resistance to below $10^3 \Omega/\square$, the boron density within the boron silicate glass film should be set to above 8.2 mol %. Incidentally, if the heat treatment is conducted for over 15 min at the temperature of above 800 degrees Centigrade, the impurity density within the polycrystalline silicon film having a thickness of below 120 nm is determined according to the boron density within the borosilicate glass film rather than by the change of the heat treatment condition within the foregoing range.

Although, in the foregoing embodiment, a case in which boron is diffused as the impurity from the borosilicate glass (BSG) film to the polycrystalline silicon film was described, a similar effect can be obtained according to the similar method even if phosphorus is diffused as the impurity from the phosphosilicate glass (PSG) film to the polycrystalline silicon film.

What is claimed is:

1. Method of manufacturing a semiconductor device comprising steps of:
    patterning a polycrystalline silicon film formed on an insulating film provided on the principal surface of a semiconductor substrate to form a polycrystalline silicon film pattern having a thickness of below 120 nm on said insulating film;
    covering said polycrystalline silicon film pattern with a silicate glass film having a p-type or n-type impurity;
    diffusing said impurity from said silicate glass film to said polycrystalline silicon film pattern by heat treatment to make said polycrystalline silicon film pattern contain said impurity at a density of above $1 \times 10^{19}$ atoms/cm$^3$ to form a resistance element comprising a polycrystalline silicon film.

2. Method of manufacturing a semiconductor device as set forth in claim 1, wherein said impurity comprises boron, and said silicate glass film comprises a borosilicate glass film.

3. Method of manufacturing a semiconductor device as set forth in claim 1, wherein said impurity comprises phosphorus, and said silicate glass film comprises a phosphosilicate glass film.

4. Method of manufacturing a semiconductor device as set forth in claim 1, wherein said polycrystalline silicon film pattern comprises a resistance body portion determining a resistance value and contact portions lying at both ends of said resistance body portion, and, said method further comprising steps of, after the impurity is diffused by said heat treatment, forming contact holes reaching said contact portions through said silicate glass film; and forming a metallic electrode line connected to said contact portions through said contact holes.

5. Method of manufacturing a semiconductor device as set forth in claim 1, wherein said insulating film has a thickness of below 300 nm.

* * * * *